United States Patent
Abe et al.

(10) Patent No.: US 8,423,175 B2
(45) Date of Patent: Apr. 16, 2013

(54) THERMAL PROCESSING APPARATUS, THERMAL PROCESSING METHOD, AND STORAGE MEDIUM

(75) Inventors: Yo Abe, Oshu (JP); Kiichi Takahashi, Oshu (JP); Junya Sato, Oshu (JP); Yoshinobu Motodate, Sendai (JP)

(73) Assignee: Tokyo Electron Limited, Minato-Ku (JP)

( * ) Notice: Subject to any disclaimer, the term of this patent is extended or adjusted under 35 U.S.C. 154(b) by 822 days.

(21) Appl. No.: 12/548,873

(22) Filed: Aug. 27, 2009

(65) Prior Publication Data

US 2010/0057249 A1 Mar. 4, 2010

(30) Foreign Application Priority Data

Aug. 29, 2008 (JP) ................................. 2008-222708

(51) Int. Cl.
*G06F 7/00* (2006.01)
(52) U.S. Cl.
USPC ........................................................ 700/214
(58) Field of Classification Search .................. 700/214, 700/230
See application file for complete search history.

(56) References Cited

U.S. PATENT DOCUMENTS

| | | | |
|---|---|---|---|
| 4,328,621 A * | 5/1982 | Benjamin | 33/534 |
| 5,981,966 A | 11/1999 | Honma | |
| 6,032,083 A | 2/2000 | Oosawa | |
| 6,203,268 B1 * | 3/2001 | Miyashita | 414/757 |
| 7,677,858 B2 | 3/2010 | Asari et al. | |
| 7,751,922 B2 | 7/2010 | Hirano et al. | |
| 7,905,700 B2 | 3/2011 | Asari et al. | |
| 8,029,224 B2 | 10/2011 | Abe et al. | |
| 2007/0248439 A1 | 10/2007 | Asari et al. | |

FOREIGN PATENT DOCUMENTS

| | | |
|---|---|---|
| JP | 07-142553 A1 | 6/1995 |
| JP | 10-154744 A1 | 6/1998 |
| JP | 11-054593 A1 | 2/1999 |
| JP | 2005-311306 A1 | 11/2005 |
| JP | 2007/251088 | 9/2007 |
| JP | 2007-251088 A1 | 9/2007 |
| JP | 2008-235841 A1 | 10/2008 |
| JP | 2009-194184 A1 | 8/2009 |
| KR | 10-1998-071504 A | 10/1998 |
| KR | 10-1999-021969 A | 3/1999 |
| WO | 2006/038584 A1 | 4/2006 |

OTHER PUBLICATIONS

Korean Office Action dated Aug. 16, 2012.
Japanese Office Action dated May 8, 2012 (with English translation).

* cited by examiner

*Primary Examiner* — Ramya Burgess
(74) *Attorney, Agent, or Firm* — Burr & Brown

(57) ABSTRACT

When a substrate is transferred by a holding arm to a multiple tier wafer boat, contact between the holding arm and the substrate is prevented. When the wafer boat is not subjected to a thermal effect, a normal height position of a ring member is obtained by relatively elevating and lowering a transfer base member with respect to the wafer boat. Before a wafer, which is not yet thermally processed, is transferred to the wafer boat, a height position of the corresponding ring member is obtained. By comparing a difference between the normal height position of the ring member and the height position of the ring member before the wafer is transported, with a threshold value, whether to transfer the wafer by the wafer transfer mechanism to the wafer boat can be judged.

7 Claims, 12 Drawing Sheets

| REFERENCE DATA (mm) | |
|---|---|
| 1-th | 626.00 |
| 2 | 620.00 |
| 3 | 614.00 |
| 4 | 608.00 |
| 5 | 602.00 |
| 6 | 596.00 |
| 7 | 590.00 |
| 8 | 584.00 |
| 9 | 578.00 |
| 10 | 572.00 |
| --- | --- |
| 96 | 50.00 |
| 97 | 44.00 |
| 98 | 38.00 |
| 99 | 32.00 |
| 100 | 26.00 |

⇕ COMPARISON

| OBTAINED DATA 1 (mm) | |
|---|---|
| 1-th | 626.97 |
| 2 | 620.95 |
| 3 | 614.92 |
| 4 | 608.85 |
| 5 | 602.81 |
| 6 | 596.79 |
| 7 | 590.73 |
| 8 | 584.70 |
| 9 | 578.68 |
| 10 | 572.65 |
| --- | --- |
| 96 | 50.35 |
| 97 | 44.32 |
| 98 | 38.30 |
| 99 | 32.28 |
| 100 | 26.23 |

⇧ DIFFERENCE

| DEVIATION (mm) | |
|---|---|
| 1-th | 0.97 |
| 2 | 0.95 |
| 3 | 0.92 |
| 4 | 0.85 |
| 5 | 0.81 |
| 6 | 0.79 |
| 7 | 0.73 |
| 8 | 0.70 |
| 9 | 0.68 |
| 10 | 0.65 |
| --- | --- |
| 96 | 0.35 |
| 97 | 0.32 |
| 98 | 0.30 |
| 99 | 0.28 |
| 100 | 0.23 |

FIG. 8

| REFERENCE DATA (mm) | | OBTAINED DATA 2 (mm) | | DEVIATION (mm) | |
|---|---|---|---|---|---|
| 1-th | 626.00 | 1-th | 627.45 | 1-th | 1.45 |
| 2 | 620.00 | 2 | 621.43 | 2 | 1.43 |
| 3 | 614.00 | 3 | 615.30 | 3 | 1.30 |
| 4 | 608.00 | 4 | 609.20 | 4 | 1.20 |
| 5 | 602.00 | 5 | 603.16 | 5 | 1.16 |
| 6 | 596.00 | 6 | 597.09 | 6 | 1.09 |
| 7 | 590.00 | 7 | 590.93 | 7 | 0.93 |
| 8 | 584.00 | 8 | 584.92 | 8 | 0.92 |
| 9 | 578.00 | 9 | 578.89 | 9 | 0.89 |
| 10 | 572.00 | 10 | 572.85 | 10 | 0.85 |
| ----- | ----- | ----- | ----- | ----- | ----- |
| 96 | 50.00 | 96 | 50.46 | 96 | 0.46 |
| 97 | 44.00 | 97 | 44.43 | 97 | 0.43 |
| 98 | 38.00 | 98 | 38.35 | 98 | 0.35 |
| 99 | 32.00 | 99 | 32.28 | 99 | 0.28 |
| 100 | 26.00 | 100 | 26.26 | 100 | 0.26 |

COMPARISON → DIFFERENCE

FIG. 9

| REFERENCE DATA (mm) | |
|---|---|
| 1-th | 626.00 |
| 2 | 620.00 |
| 3 | 614.00 |
| 4 | 608.00 |
| 5 | 602.00 |
| 6 | 596.00 |
| 7 | 590.00 |
| 8 | 584.00 |
| 9 | 578.00 |
| 10 | 572.00 |
| ---- | ---- |
| 96 | 50.00 |
| 97 | 44.00 |
| 98 | 38.00 |
| 99 | 32.00 |
| 100 | 26.00 |

COMPARISON

| OBTAINED DATA 3 (mm) | |
|---|---|
| 1-th | 628.61 |
| 2 | 622.59 |
| 3 | 616.54 |
| 4 | 610.54 |
| 5 | 604.51 |
| 6 | 598.47 |
| 7 | 592.44 |
| 8 | 586.43 |
| 9 | 580.40 |
| 10 | 574.39 |
| ---- | ---- |
| 96 | 52.15 |
| 97 | 46.14 |
| 98 | 40.12 |
| 99 | 34.09 |
| 100 | 28.03 |

DIFFERENCE

| DEVIATION (mm) | |
|---|---|
| 1-th | 2.61 |
| 2 | 2.59 |
| 3 | 2.56 |
| 4 | 2.54 |
| 5 | 2.51 |
| 6 | 2.47 |
| 7 | 2.44 |
| 8 | 2.43 |
| 9 | 2.40 |
| 10 | 2.39 |
| ---- | ---- |
| 96 | 2.15 |
| 97 | 2.14 |
| 98 | 2.12 |
| 99 | 2.09 |
| 100 | 2.03 |

FIG. 10

THERMAL PROCESSING APPARATUS, THERMAL PROCESSING METHOD, AND STORAGE MEDIUM

CROSS REFERENCE TO RELATED APPLICATIONS

This application is based upon and claims the benefit of priority from the prior Japanese Patent Application No. 2008-222708 filed on Aug. 29, 2008, the entire contents of which are incorporated herein by reference.

FIELD OF THE INVENTION

The present invention relates to a technique for delivering substrates such as semiconductor wafers by a substrate transfer means to and from a substrate holder, in a vertical thermal processing apparatus that thermally processes substrates held by the substrate holder in a tier-like manner.

BACKGROUND ART

One of semiconductor manufacturing apparatuses, there is a vertical thermal processing apparatus that thermally processes a number of semiconductor wafers (hereinafter referred to as "wafers") in block (batch). As shown in FIG. 11, for example, the vertical thermal processing apparatus includes a charge/discharge area through which a carrier, not shown, accommodating a plurality of wafers is carried to and from the outside. The wafers in the carrier are transferred by a transfer apparatus 11 to a wafer boat 12 capable of holding a number of wafers 1 in a tier-like manner. By loading the wafer boat 12 to a thermal processing furnace, not shown, a predetermined thermal process is simultaneously performed to the wafers 1.

The transfer apparatus 11 includes: a base table 13 capable of being elevated and lowered, being rotated about a substantially vertical axis, and of being substantially horizontally moved; and forks 14 for holding a plurality of, e.g., five wafers 1, the forks 14 being capable of being moved along the base table 13. For example, five wafers 1 can be transferred and transferred in batch by, e.g., the five forks 14 between the carrier and the wafer boat 12. As shown in FIGS. 11 and 12, for example, the wafer boat 12 has: a plurality of columns 15; a number of holding parts 16 (see, FIG. 12) formed in the columns 15 for holding peripheral portions of wafers, which are spaced at predetermined intervals therebetween in the up and down direction; and ring members 17 interposed between the holding portions 16 adjacent to each other in the up and down direction.

In the carrier, wafers are also held with their peripheral portions by not-shown holding parts, with predetermined intervals between the wafers adjacent to each other in the up and down direction. As shown in FIG. 12(a), the wafers 1 are received from the carrier and the wafer boat 12 in the following manner. At first, the respective five forks 14 are inserted to spaces below the wafers 1 held by the carrier or the wafer boat 12, and the forks 14 are elevated so as to float up the wafers 1. Then, the wafers 1 are received by the respective forks 14 and the forks 14 are retracted, whereby the wafers 1 are received from the carrier or the wafer boat 12. Thereafter, the wafers 1 are transferred by the transfer apparatus 11 to an object to which the wafers 1 are to be transferred.

In the wafer boat 12, there is a demand for holding wafers 1 as many as possible in order to improve a throughput of a process, and thus pitches between the wafers 1 arranged in the wafer boat 12 tend to be narrowed. In particular, in the wafer boat 12 of a type in which the ring members 17 are interposed between the wafers 1 adjacent to each other in the up and down direction, there is a case in which a pitch interval between the wafers 1 is smaller than 10 mm. Since the wafers 1 and the ring member 17 are arranged in this narrow space, when the fork 14 is moved into (or retracted from) the space between the wafer 1 and the ring member 17, a clearance between the fork 14 and the ring member 17 in the up and down direction is smaller than 1 mm. On the other hand, although the wafer boat is generally made of quartz, when a process temperature exceeds, e.g., 1000° C., the wafer boat 12 is deformed by the thermal effect, so that the clearance may differ from the clearance upon teaching. The following reasons are considered for this deformation. Namely, since a succeeding process is started before the thermally expanded wafer boat 12 is not sufficiently cooled, the wafer boat 12 is subjected again to a thermal effect without the deformed wafer boat 12 returning to the original state. In addition, since the ring member 17 is larger than the wafer, the ring member 17 is vulnerable to the thermal effect, and is likely to be lowered by its own weight from a set position. As the number of the process increases, the degree of the deformation becomes serious because of these reasons.

Suppose that the clearance differs from the clearance upon teaching. As shown in FIG. 12(b), when the wafer 1 is transferred by the fork 14, there is a possibility that the wafer 1 and the fork 14 might come into contact with each other so that the surface of the wafer 1 might get scratched, and that the wafer 1 and the fork 14 might come into contact with each other so that the transfer of the wafer 1 cannot be performed.

Citation 1 describes a vertical thermal processing apparatus including a substrate holder capable of holding a plurality of objects to be processed in a tier-like manner in the up and down direction, and a transfer mechanism that transfers objects to be processed to the substrate holder, wherein information as to a feedback position, a velocity, and a current of a motor for driving the transfer mechanism are monitored, while the information and a preset information as to the normal driving state of the motor are compared to each other. Upon detection of an abnormality, the driving of the transfer mechanism is stopped. However, this technique is a countermeasure taken when the driving of the transfer mechanism become abnormal, and is not a countermeasure when the substrate holder becomes abnormal. Thus, this technique cannot solve the problem of the present invention.

[Patent Document 1] JP2007-251088A

DISCLOSURE OF THE INVENTION

The present invention has been made in view of the above circumstances. The object of the present invention is to provide a technique for preventing, when substrates are delivered by a substrate transfer means to and from a substrate holder capable of holding a plurality of substrates in a tier-like manner, a contact between a holding arm and a substrate and a contact between the holding arm and the substrate holder.

The present invention is a vertical thermal processing apparatus comprising: a thermal processing furnace; a substrate holder configured to be carried into the thermal processing furnace and to hold a substrate; a substrate transfer means including a holding arm configured to hold a substrate and a transfer base member configured to support the holding arm; a height-position detecting part disposed on the substrate transfer means, the height-position detecting part being configured to detect a height position of the substrate transfer means with respect to the substrate holder; a driving part controlled based on the height position detected by the height-position detecting part, the driving part being configured to relatively elevate and lower the substrate transfer means with respect to the substrate holder; a specific-portion detecting part disposed on the substrate transfer means, the specific-portion detecting part being configured to detect, when the substrate transfer means is relatively elevated and lowered with respect to the substrate holder, a substrate placed on each step of the substrate holder or a specific portion of the substrate holder, the specific portion having a specific relationship with respect to each substrate; a means configured to read the height position detected by the height-position detecting part, when the specific-portion detecting part detects the substrate or the specific portion; and a control part configured to control the substrate transfer means; wherein the control part includes: a difference detecting means configured to calculate a difference between a normal height position of each substrate or a normal height position of each specific portion, which height position is obtained by relatively elevating and lowering the substrate transfer means with respect to the substrate holder under the condition that the substrate holder is not subjected to a thermal effect, and a height position of each corresponding substrate or a height position of each corresponding specific portion, which height position is obtained by relatively elevating and lowering the substrate transfer means with respect to the substrate holder at a time of the operation of the vertical thermal processing apparatus; a judging means configured to compare the difference and a threshold value and to judge whether the transfer operation of the substrate from or to the substrate holder can be performed or not based on the comparison result; and a means configured to forbid the transfer operation of the substrate by the substrate transfer means, when the judging means judges that the transfer operation of the substrate can not be performed.

The present invention is the vertical thermal processing apparatus wherein: the substrate transfer means is structured to be capable of switching from a single transfer mode of one substrate by the one holding arm to a simultaneous transfer mode of a plurality of substrates by the plurality of holding arms; and the judging means compares the difference with a first threshold value and with a second threshold value that is larger than the first threshold value, and the judging means judges that the transfer operation of the substrates by the plurality of holding arms can be performed when the difference is less than the first threshold value; the judging means judges that the transfer operation of the substrate by the one holding arm can be performed when the difference is not less than the first threshold value but less than the second threshold value; or the judging means judges that the transfer operation of the substrate from or to the substrate holder can not be performed when the difference is not less than the second threshold value.

The present invention is the vertical thermal processing apparatus wherein the specific-portion detecting part is formed of a mapping sensor including a light-emitting part and a light-receiving part for detecting presence of the plurality of substrates placed on each step of the substrate holder.

The present invention is the vertical thermal processing apparatus wherein the substrate holder includes a ring member interposed between the substrates placed in the substrate holder, the substrates being adjacent to each other in an up and down direction, and the specific portion corresponds to the ring member.

The present invention is the vertical thermal processing apparatus wherein the time of the operation of the vertical thermal processing apparatus corresponds to a timing before a thermally processed substrate is taken out from the substrate holder.

The present invention is the vertical processing apparatus wherein the time of the operation of the vertical processing apparatus corresponds to a timing after a thermally processed substrate have been already taken out from the substrate holder and before a substrate to be thermally processed subsequently is not yet transferred to the substrate holder.

The present invention is a vertical thermal processing apparatus comprising: a thermal processing furnace; a substrate holder configured to be carried into the thermal processing furnace and to hold a substrate; a substrate transfer means including a holding arm configured to hold a substrate and a transfer base member configured to support the holding arm; a height-position detecting part disposed on the substrate transfer means, the height-position detecting part being configured to detect a height position of the substrate transfer means with respect to the substrate holder; a driving part controlled based on the height position detected by the height-position detecting part, the driving part being configured to relatively elevate and lower the substrate transfer means with respect to the substrate holder; a specific-portion detecting part disposed on the substrate transfer means, the specific-portion detecting part being configured to detect, when the substrate transfer means is relatively elevated and lowered with respect to the substrate holder, a substrate placed on each step of the substrate holder or a specific portion of the substrate holder, the specific portion having a specific relationship with respect to each substrate; a means configured to read the height position detected by the height-position detecting part, when the specific-portion detecting part detects the substrate or the specific portion; and a control part configured to control the substrate transfer means; wherein the control part includes: a difference detecting means configured to calculate a difference between a normal distance between each substrate and a substrate adjacent to the substrate or a normal distance between each specific portion and a specific portion adjacent to the specific portion, which distance is obtained by relatively elevating and lowering the substrate transfer means with respect to the substrate holder under the condition that the substrate holder is not subjected to a thermal effect, and a distance between each corresponding substrate and the substrate adjacent to the substrate or a distance between each corresponding specific portion and the specific portion adjacent to the specific portion, which distance is obtained by relatively elevating and lowering the substrate transfer means with respect to the substrate holder at a time of the operation of the vertical thermal processing apparatus; a judging means configured to compare the difference and a threshold value and to judge whether the transfer operation of the substrate from or to the substrate holder can be performed or not based on the comparison result; and a means configured to forbid the transfer operation of the substrate by the substrate transfer means, when the judging means judges that the transfer operation of the substrate can not be performed.

The present invention is a thermal processing method performed by a vertical thermal processing apparatus comprising a thermal processing furnace, a substrate holder configured to be carried into the thermal processing furnace and to hold a substrate, and a substrate transfer means including a holding arm configured to hold a substrate and a transfer base member configured to support the holding arm, the vertical thermal processing apparatus being configured to thermally process the substrate; the thermal processing method comprising: obtaining, as a normal height position, a height position of the substrate placed on each step of the substrate holder or a height position of a specific portion of the substrate holder, the specific portion having a specific relationship with respect to each substrate, under the condition that the substrate holder is not subjected to a thermal effect; obtaining, a height position of each corresponding substrate or a height position of each corresponding specific portion, at a time of the operation of the vertical thermal processing apparatus; calculating a difference between the normal height position of each substrate or the normal height position of each specific portion, and the height position of each substrate or the height position of each specific part, the height position being obtained at the time of the operation of the vertical thermal processing apparatus; comparing the difference with a threshold value and judging whether the transfer operation of the substrate from or to the substrate holder can be performed or not based on the comparison result; and forbidding the transfer operation of the substrate by the substrate transfer means when it is judged that the transfer operation of the substrate can not be performed.

The present invention is the thermal processing method wherein: the substrate transfer means is capable of switching from a single transfer mode of one substrate by the one holding arm to a simultaneous transfer mode of a plurality of substrates by the plurality of holding arms; in the judging, the difference is compared with a first threshold value and with a second threshold value that is larger than the first threshold value, and the transfer operation of the substrates by the plurality of holding arms can be performed when the difference is less than the first threshold value, the transfer operation of the substrate by the one holding arm can be performed when the difference is not less than the first threshold value but less than the second threshold value, and the transfer operation of the substrate from or to the substrate holder can not be performed when the difference is not less than the second threshold value.

The present invention is a thermal processing method performed by a vertical thermal processing apparatus comprising a thermal processing furnace, a substrate holder configured to be carried into the thermal processing furnace and to hold a substrate, and a substrate transfer means including a holding arm configured to hold a substrate and a transfer base member configured to support the holding arm, the vertical thermal processing apparatus being configured to thermally process the substrate; the thermal processing method comprising: obtaining, as a normal height position, a height position of the substrate placed on each step of the substrate holder or a height position of a specific portion of the substrate holder, the specific portion having a specific relationship with respect to each substrate, under the condition that the substrate holder is not subjected to a thermal effect; obtaining a height position of each corresponding substrate or a height position of each corresponding specific portion at a time of the operation of the vertical thermal processing apparatus; calculating a difference between the normal distance between each substrate and a substrate adjacent to the substrate or a normal distance between each specific portion and a specific portion adjacent to the specific portion, and a distance between each corresponding substrate and the substrate adjacent thereto or a distance between each corresponding specific portion and the specific portion adjacent to the specific portion, the distance being obtained at the time of the operation of the vertical thermal processing apparatus; comparing the difference with a threshold value and judging whether the transfer operation of the substrate from or to the substrate holder can be performed or not based on the comparison result; and forbidding the transfer operation of the substrate by the substrate transfer means when it is judged that the transfer operation of the substrate can not be performed.

The present invention is a storage medium storing a computer program executable by a computer to implement a thermal processing method performed by a thermal processing apparatus comprising a thermal processing furnace, a substrate holder configured to be carried into the thermal processing furnace and to hold a substrate, and a substrate transfer means including a holding arm configured to hold a substrate and a transfer base member configured to support the holding arm, the vertical thermal processing apparatus being configured to thermally process the substrate; the thermal processing method comprising: obtaining, as a normal height position, a height position of the substrate placed on each step of the substrate holder or a height position of a specific portion of the substrate holder, the specific portion having a specific relationship with respect to each substrate, under the condition that the substrate holder is not subjected to a thermal effect; obtaining, a height position of each corresponding substrate or a height position of each corresponding specific portion, at a time of the operation of the vertical thermal processing apparatus; calculating a difference between the normal height position of each substrate or the normal height position of each specific portion, and the height position of each substrate or the height position of each specific part, the height position being obtained at the time of the operation of the vertical thermal processing apparatus; comparing the difference with a threshold value and judging whether the transfer operation of the substrate from or to the substrate holder can be performed or not based on the comparison result; and forbidding the transfer operation of the substrate by the substrate transfer means when it is judged that the transfer operation of the substrate can not be performed.

The present invention is a storage medium storing a computer program executable by a computer to implement a thermal processing method performed by a thermal processing apparatus comprising a thermal processing furnace, a substrate holder configured to be carried into the thermal processing furnace and to hold a substrate, and a substrate transfer means including a holding arm configured to hold a substrate and a transfer base member configured to support the holding arm, the vertical thermal processing apparatus being configured to thermally process the substrate; the thermal processing method comprising: obtaining, as a normal height position, a height position of the substrate placed on each step of the substrate holder or a height position of a specific portion of the substrate holder, the specific portion having a specific relationship with respect to each substrate, under the condition that the substrate holder is not subjected to a thermal effect; obtaining a height position of each corresponding substrate or a height position of each corresponding specific portion at a time of the operation of the vertical thermal processing apparatus; calculating a difference between the normal distance between each substrate and a substrate adjacent to the substrate or a normal distance between each specific portion and a specific portion adjacent to the specific portion, and a distance between each corresponding substrate and the substrate adjacent thereto or a distance between each corresponding specific portion and the specific portion adjacent to the specific portion, the distance being obtained at the time of the operation of the vertical thermal processing apparatus; comparing the difference with a threshold value and judging whether the transfer operation of the substrate from or to the substrate holder can be performed or not based on the comparison result; and forbidding the transfer operation of the substrate by the substrate transfer means when it is judged that the transfer operation of the substrate can not be performed.

According to the present invention, at the time of the operation of the vertical thermal processing apparatus, a difference between the height position of the specific portion of the substrate holder, the specific portion having a specific relationship with respect to the substrate, and the normal height position of the specific portion is calculated. By comparing the difference and the threshold value, whether to deliver the substrate by the substrate transfer means to the substrate holder is performed or not is judged. When it is judged that the transfer operation of the substrate can not be performed, the transfer operation of the substrate by the substrate transfer means is forbidden. Thus, when the substrate is transferred to the substrate holder by the holding arm disposed on the substrate transfer means, a contact between the holding arm and the substrate and a contact between the holding arm and the substrate holder can be prevented.

BRIEF DESCRIPTION OF THE DRAWINGS

FIG. 8 is a characteristic view showing obtained data 1 of height positions of ring members in the wafer boat.

FIG. 9 is a characteristic view showing obtained data 2 of the height positions of the ring members in the wafer boat.

FIG. 10 is a characteristic view showing obtained data 3 of the height positions of the ring members in the wafer boat.

BEST MODE FOR CARRYING OUT THE INVENTION

Figure 1:
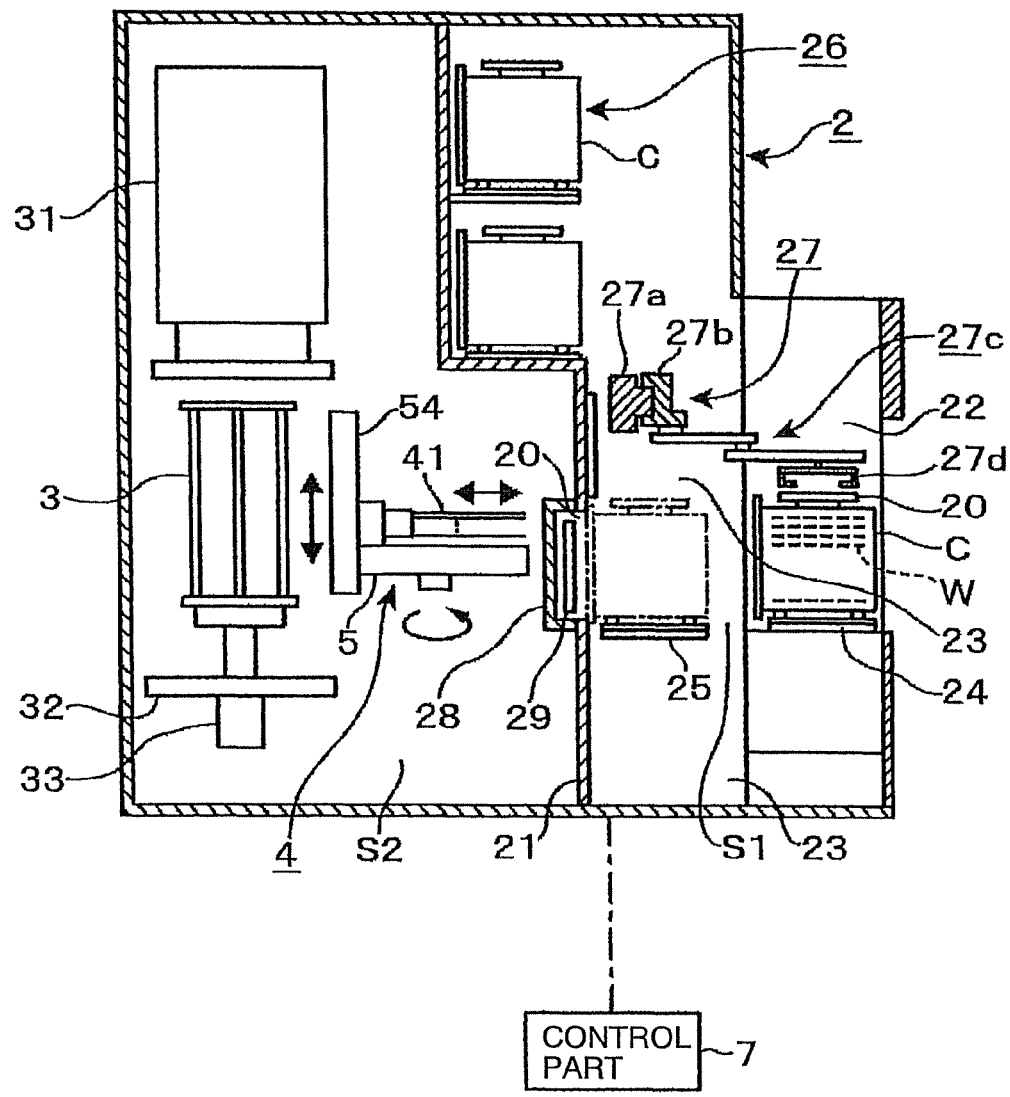
FIG. 1 is a sectional view showing an embodiment of a thermal processing apparatus according to the present invention.
Figure 2:
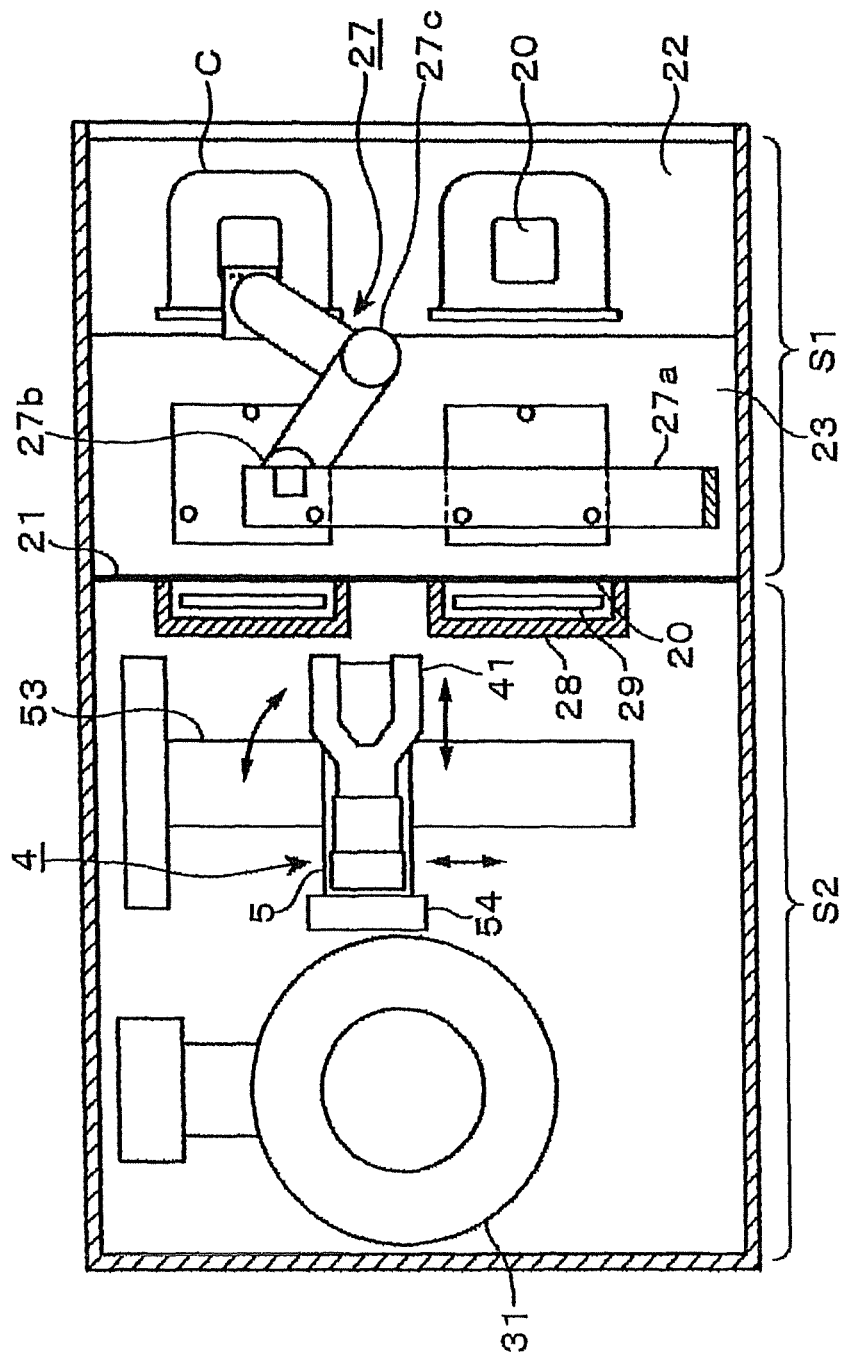
FIG. 2 is a plan view showing the thermal processing apparatus.

An embodiment of a vertical thermal processing apparatus of the present invention is described herebelow. FIG. 1 is a longitudinal sectional view showing an inside of the vertical thermal processing apparatus, and FIG. 2 is a schematic plan view thereof. In the drawings, the reference number 2 depicts a housing defining an external body of the apparatus. In the housing 2, there are disposed a charge/discharge area S1 through which a carrier C serving as a container containing wafers W as substrates, is carried into the apparatus and carried out therefrom, and a loading area S2 as a transport area (transfer area) through which the wafers in the carrier C are transferred and loaded into the below-described thermal processing furnace. The charge/discharge area S1 and the loading area S2 are separated from each other by a partition wall 21. The charge/discharge area S1 is filled with an atmospheric air, and the loading area S2 is filled with an inert gas atmosphere, such as nitrogen ($N_2$) gas atmosphere, or a clean and dry gas atmosphere (a gas containing less particles and organic components, and having a dewpoint not more than $-60°$ C.).

The charge/discharge area S1 is composed of a first area 22 that is located on a front side when viewed from the front side of the apparatus, and a second area 23 located on a rear side. The first area 22 is provided with a first table 24 on which a plurality of, e.g., two carriers can be placed. As the carrier C, there is used a carrier C capable of accommodating therein a plurality of, e.g., twenty five 300-mm wafers as substrates that are arranged in a tier-like manner with predetermined intervals therebetween. The carrier C is made of a resin, for example, and can be sealed by closing a not-shown opening in the front surface by a lid member. A second table 25 is disposed in the second area 23 of the charge/discharge area S1. On an upper part of the second area 23, there are disposed a carrier storage part 26 in which the carrier C can be stored, and a carrier transfer mechanism 27 that transfers the carrier C between the first table 24, the second table 25, and the carrier storage part 26. The carrier transfer mechanism 27 includes: an elevating and lowering part 27a capable of being elevated and lowered and having a guide rail extending in the right and left direction; a moving part 27b capable of being moved in the right and left direction while being guided by the guide rail; and two arms 27 disposed on the moving part 27b, the arms 27 being capable of horizontally transferring the carrier C by holding a flange part 20 on an upper surface of the carrier C by means of a holding part 27d.

The partition wall 21 is provided with an opening 20 that communicates the inside of the carrier C and the loading area S2 when the carrier C placed on the second table 25 is brought into contact with the partition wall 21. On the side of the loading area S2, the partition wall 21 has a door 28 that opens and closes the opening 20, and a lid opening/closing mechanism 29 that opens and closes the lid member of the carrier C while the door 28 is being closed. After the lid member of the carrier C is opened, the door 28 is configured to be retracted upward or downward, for example, by a not-shown door opening/closing mechanism, such that the lid opening/closing mechanism 29 and the lid member do not interfere with the transfer of the wafers W. An inert-gas supply pipe (not shown) is disposed on an edge side of the opening 20 of the partition wall 21, and an exhaust channel (not shown) is disposed on a lower end side of the opening 20. These inert-gas supply pipe and the exhaust channel constitute a gas replacing means that supplies an inert gas such as a nitrogen gas into the carrier C with its lid member being opened so as to replace an inside air of the carrier C with the inert gas.

The vertical thermal processing apparatus of the present invention includes a thermal processing furnace 31, a wafer boat 3, and a wafer transfer mechanism 4, which are described herebelow.

Namely, the loading area S2 is equipped with the vertical thermal processing furnace 31 having a lower end thereof being opened as a furnace opening. Below the thermal processing furnace 31, the wafer boat 3, which is a substrate holder for holding a number of wafers W in a tier-like manner with predetermined intervals therebetween, is placed on a cap 32. The cap 32 is supported by an elevating and lowering mechanism 33. The wafer boat 3 can be carried into and out of the thermal processing furnace 31 by the elevating and lowering mechanism 33. The wafer transfer mechanism 4 as a substrate transfer means is disposed between the wafer boat 3 and the opening 20 of the partition wall 21. Wafers can be transferred by the wafer transfer mechanism 4 between the wafer boat 3 and the carrier C placed on the second table 25.

Figure 3:
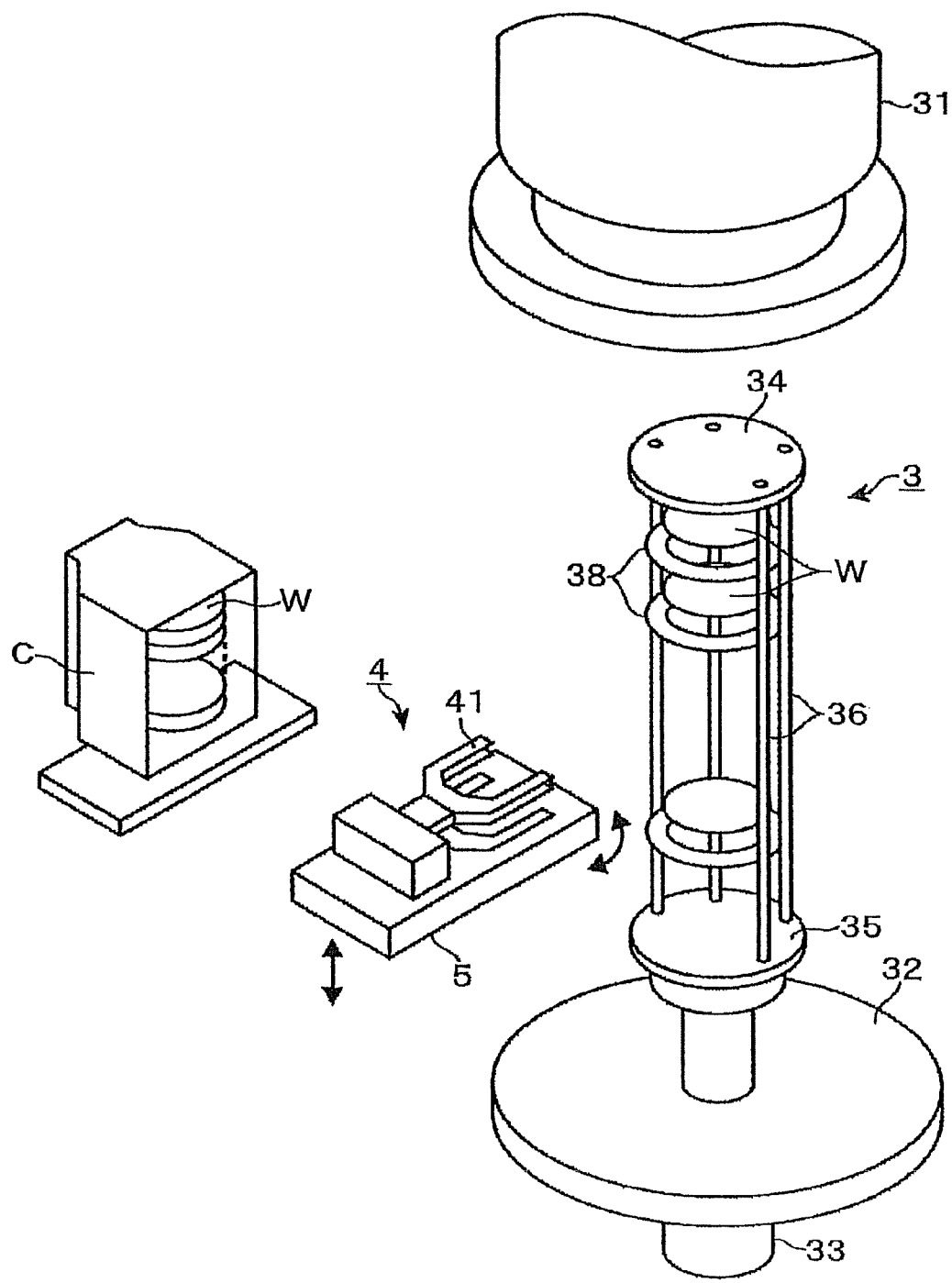
FIG. 3 is a schematic perspective view showing a wafer transfer mechanism, a carrier, and a wafer boat disposed on the thermal processing apparatus.
Figure 4:
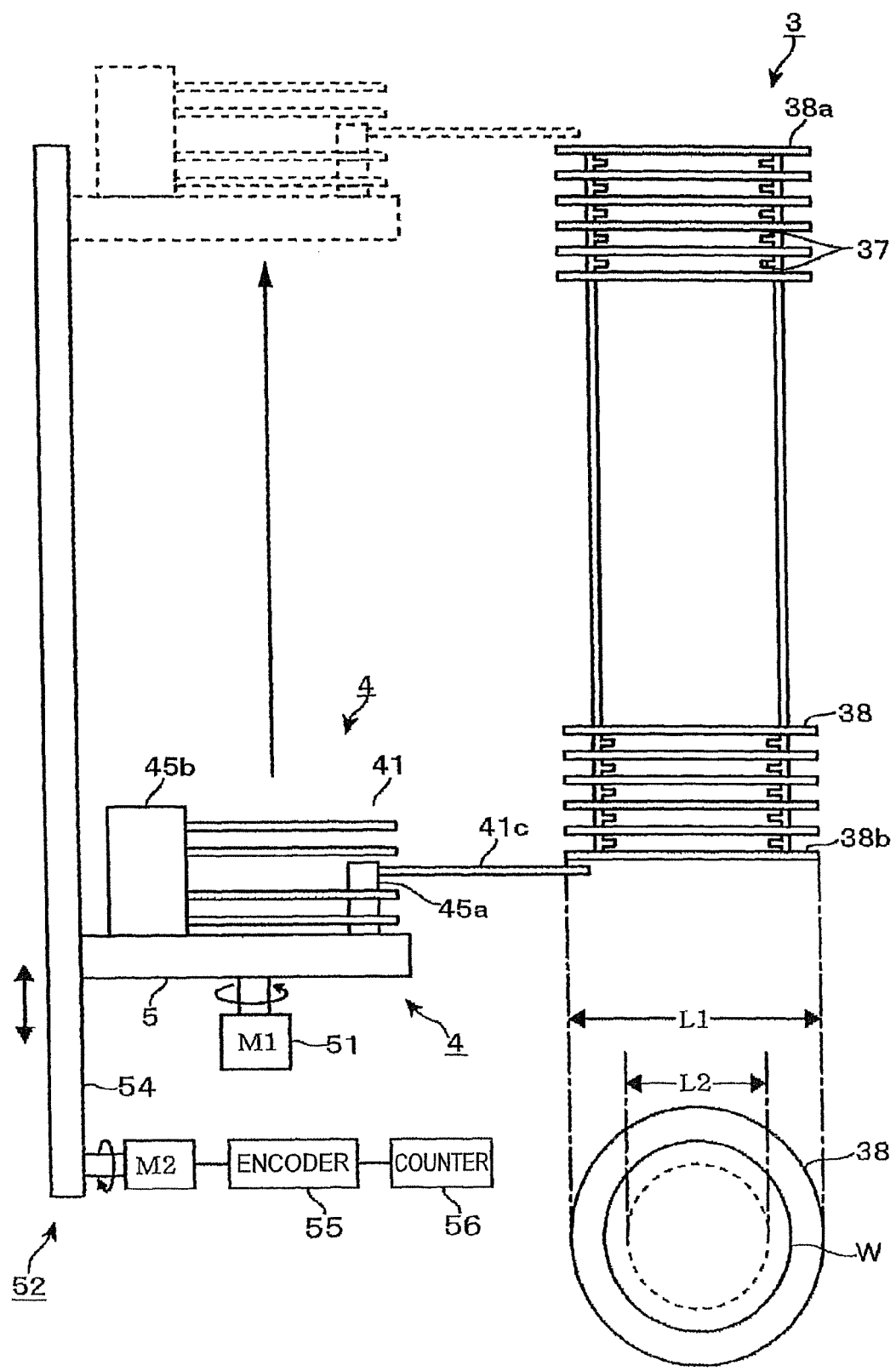
FIG. 4 is a side view of the wafer transfer mechanism and the wafer boat.

As shown in FIGS. 3 and 4, the wafer boat 3 includes a plurality of columns 36 extending between a top plate 34 and a bottom plate 35. The columns 36 has holding paws 37 on which peripheral portions of wafers can be placed. Ring members 38 are interposed between the holding pawls 37 adjacent to each other in the up and down direction. The ring members 38 are provided for improving an in-plane uniformity of a film thickness of a film formed on each wafer W and an in-plane uniformity of a thermal process. The ring members 38 correspond to specific portions having specific relationships with respect to the wafers W in the wafer boat 3. Such a ring member 38 is made of, e.g., quartz. As shown in FIG. 4, an outside diameter L1 and an inside diameter L2 of the ring member 38 are set such that the peripheral region of the wafer W and the ring member 38 are overlapped with each other, when the wafer W and the ring member 38 disposed therebelow are viewed in a plan view. An arrangement interval between the holding pawls 37 adjacent to each other in the up and down direction is set at about 10 mm, and an arrangement interval between the ring members 38 adjacent to each other in the up and down direction is set at about 10 mm.

The wafer transfer mechanism 4 includes a plurality of, e.g., five forks 41 (41a to 41e) each of which is formed of a holding arm for holding a wafer W, and a transfer base member 5 that supports the forks 41a to 41e so as to be movable forward and rearward. The transfer base member 5 is rotated about the vertical axis by a rotational mechanism 51 formed of a motor M1, is elevated and lowered by an elevating and lowering mechanism 52, and is moved in the right and left direction along a guide rail 53 (see, FIG. 2) extending in the right and left direction along the arrangement direction of the carriers C. The elevating and lowering mechanism 52 is configured to rotate a not-shown elevation shaft, which is disposed inside the guide rail 54 extending in the up and down direction, by a motor M2 so as to elevate and lower the transfer base member 5 along the guide rail 54, for example. The motor M2 is connected to an encoder 55. The reference number 56 depicts a counter that counts the pulse number of the encoder 55.

Figure 5A:
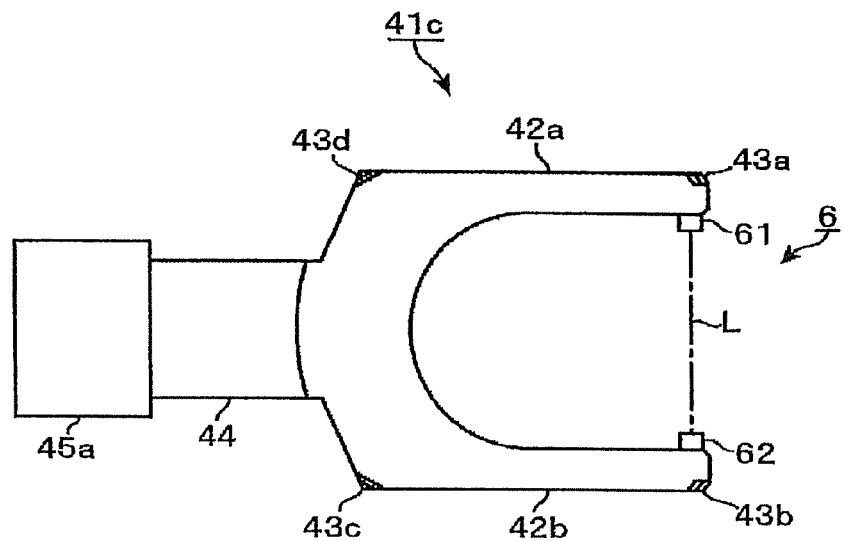
FIGS. 5(a) and 5(b) are a plan view and a side view showing the wafer transfer mechanism.
Figure 5B:
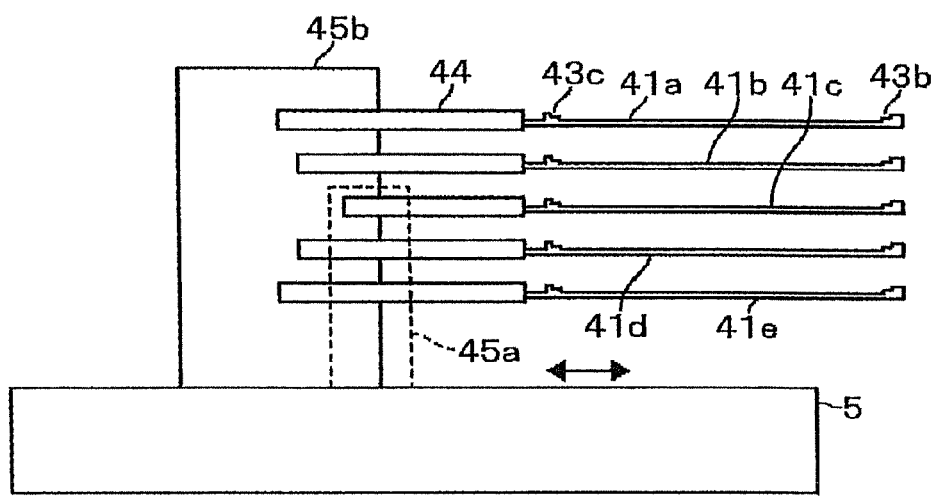

As shown in FIGS. 5(a) and 5(b), the forks 41 consist of the five forks, i.e., the first fork 41a, the second fork 41b, the third fork 41c, the fourth fork 41d, and the fifth fork 41d, each of which can hold a wafer W. When viewed in a plan view, each of the forks 41a to 41e has two arm parts 42a and 42b extending in the forward and rearward direction with a predetermined space interposed therebetween. In each of the forks 41a to 41e, the peripheral portion of a wafer W can be placed on two locations on a distal side of the arm parts 42a and 42b of the fork 41 and two locations on a proximal side thereof, i.e., the peripheral portion of the wafer can be placed on stepped parts 42a, 43b, 43c, and 43d. Thus, the wafer W can be held such that the wafer is slightly floated upward from the fork 41. A proximal part of each fork 41 is secured on a moving mechanism 45 via a holding member 44.

In this example, for example, the third fork 41c can be independently moved forward and rearward along the transfer base member 5, and the rest four forks 41a, 41b, 41d, and 41e, excluding the fork 41c, can be simultaneously moved forward and rearward. Namely, the transfer base member 5 includes a first moving mechanism 45a for moving forward the third fork 41c, and a second moving mechanism 45b for simultaneously moving forward the four forks 41a, 45b, 41d, and 41e, excluding the third fork 41c. The moving mechanisms 45a and 45b can be respectively moved in the forward and rearward direction along the transfer base member 5. That is to say, in the wafer transfer mechanism 4, there can be performed both a single transfer in which one wafer W is transferred by an independent movement of the first moving mechanism 45a, and a batch transfer in which a plurality of, e.g., five wafers are simultaneously transferred by a cooperation of the first and the second moving mechanisms 45a and 45b.

An optical sensor 6 forming a specific-portion detecting part is provided on the third fork 41c. The optical sensor 6 is formed of a light-block type optical sensor, for example. A mapping sensor for detecting presence of wafers W held on the wafer boat 3 can be used as the optical sensor 6. The optical sensor 6 is fixed on the distal end of the third fork 41c such that a horizontal optical axis L can be formed. For example, a light-emitting part 61 is fixed on an inner surface of one of the arm parts 42a and 42b (in this example, on the inner surface of the arm part 42a), and a light-receiving part 62 is fixed on an inner surface of the other of the arm parts 42a and 42b (in this example, on the inner surface of the arm part 42b) at a position where the light axis L from the light-emitting part 61 is received. Thus, the light-receiving part 62 is opposed to the light-emitting part 61.

Figure 6:
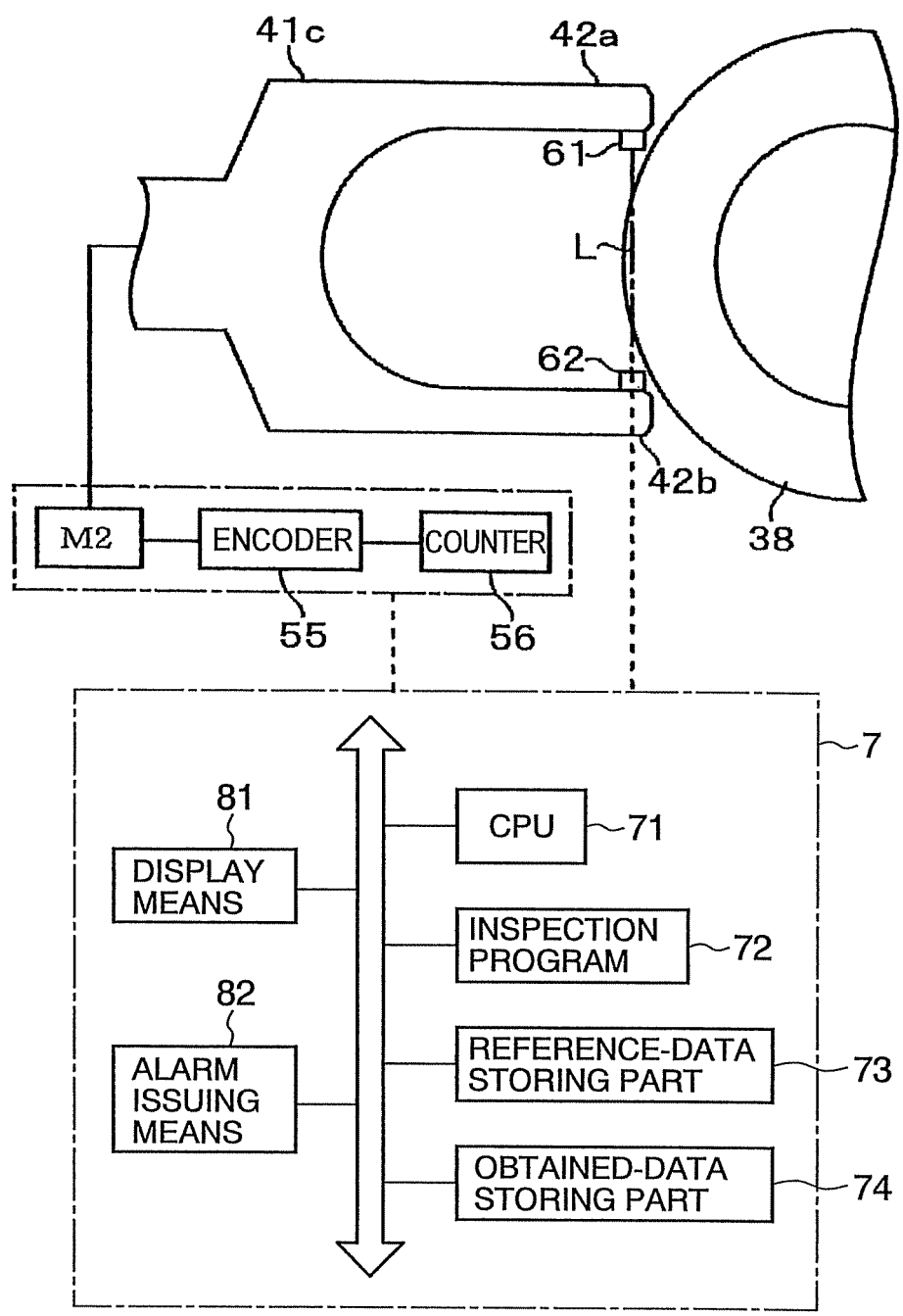
FIG. 6 is s structural view showing the wafer transfer mechanism and a control part.
Figure 7:
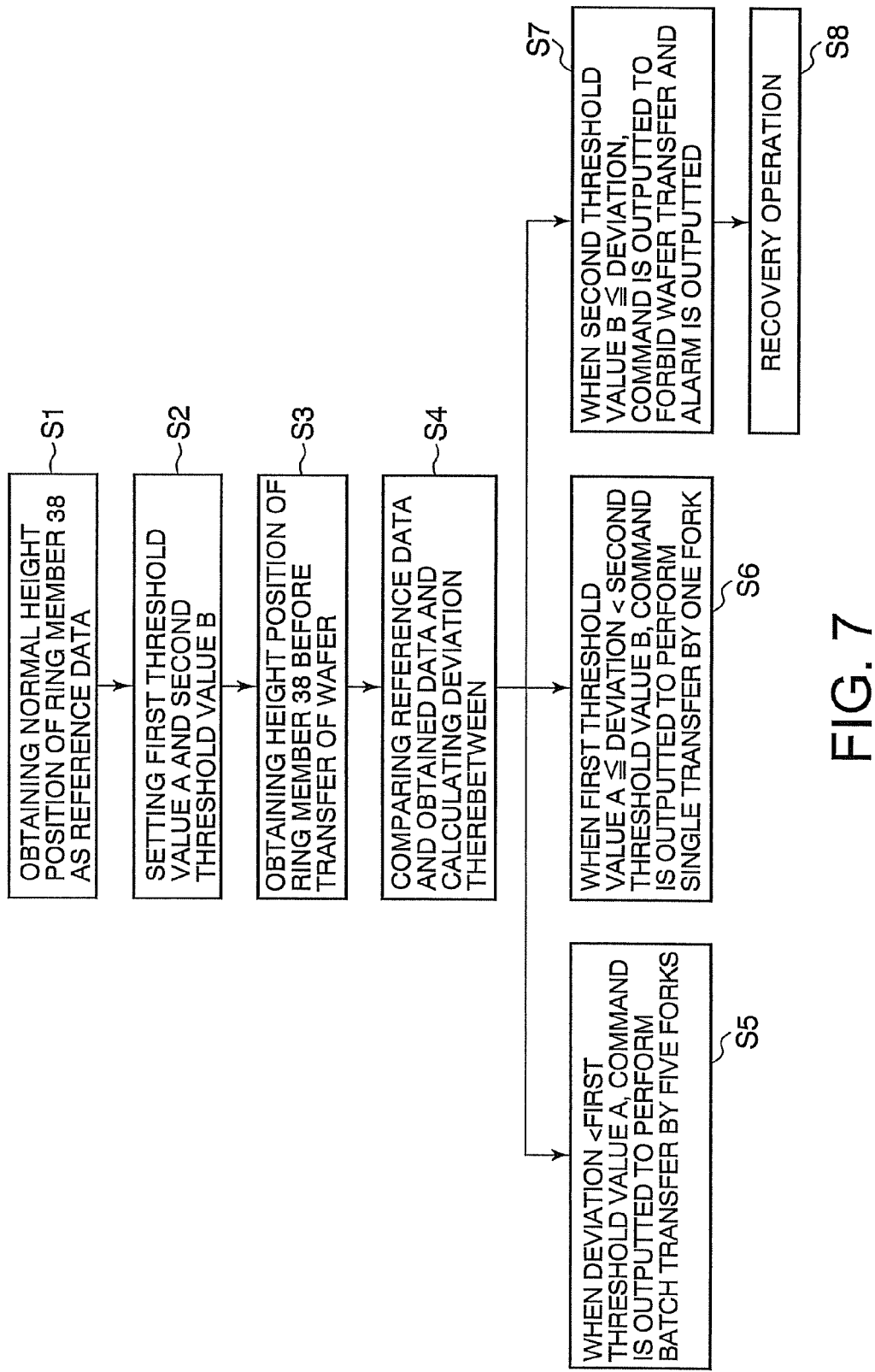
FIG. 7 is a flowchart for explaining an inspection of the wafer boat.
Figure 11:
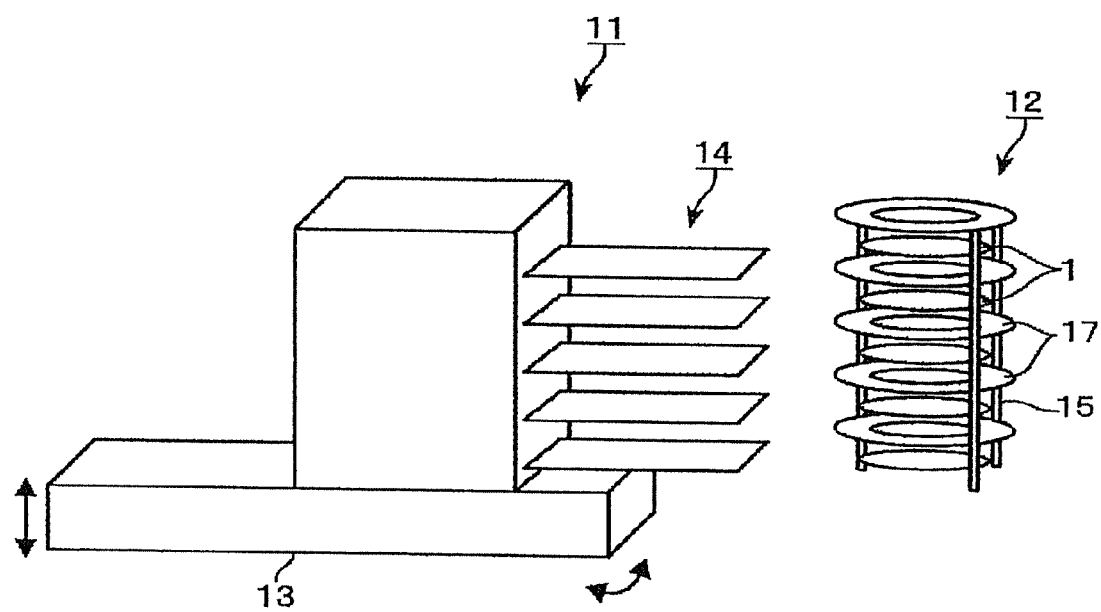
FIG. 11 is a schematic perspective view showing a conventional transfer apparatus and a wafer boat.
Figure 12A:
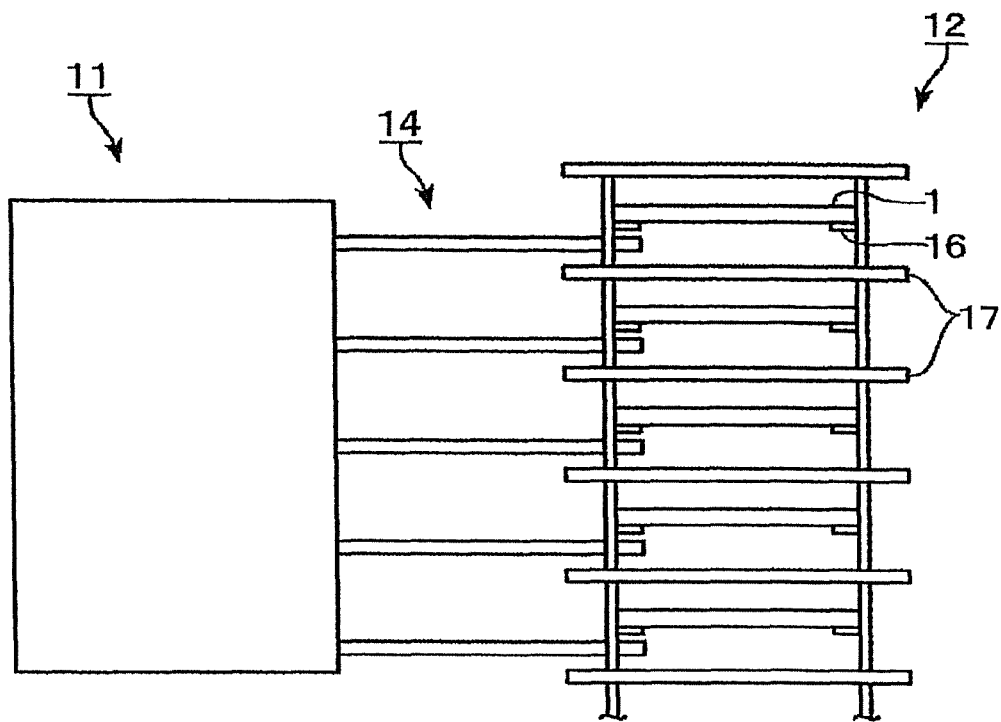
FIGS. 12(a) and 12(b) are side views showing the conventional transfer apparatus and the wafer boat.
Figure 12B:
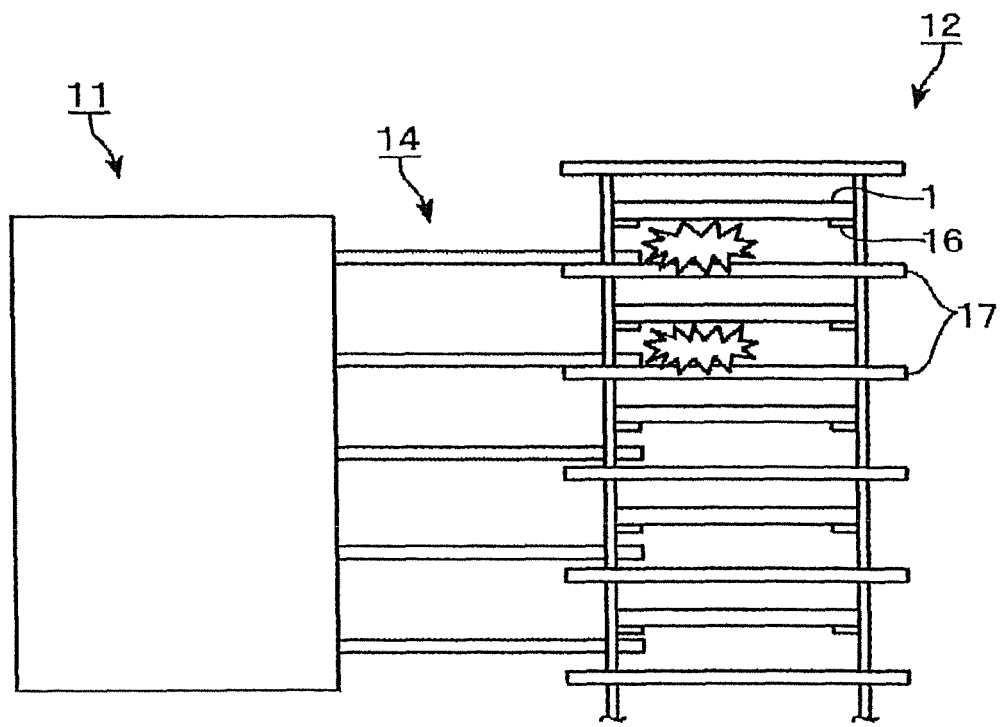

A positional relationship between the third fork 41c and the ring member 38 is described with reference to FIG. 6. When the third fork 41c is located on an inspection position facing the ring member 38, and the transfer base member 5 is relatively elevated and lowered with respect to the wafer boat 3, the third fork 41c is elevated and lowered so as not to interfere with the ring members 38, but the optical axis L formed nearby the distal end of the fork 41c by the optical sensor 6 fixed on the third fork 41c blocks a part of the respective ring members 38.

Thus, when the transfer base member 5 is relatively elevated and lowered with respect to the wafer boat 3, the optical axis L is blocked by each ring member 38. That is to say, a timing at which the optical sensor 6 detects data showing that a light ray is blocked is a timing at which the ring member 38 is detected. On the other hand, a height position of the transfer base member 5 is always monitored. When the optical sensor 6 detects the light-block data, the height position of the transfer base member 5 is read out. Then, a correspondence between the height position of the transfer base member 5 and the height position of the ring member 38 as the specific portion is determined. With the use of the correspondence, the height of the ring member 38 can be calculated. In this example, the height position of the transfer base member 5 is read out by counting the pulse number of the encoder 55 by the counter 56. Based on this, height position data of the respective ring members 38 in the wafer boat 3 can be detected.

The encoder 55 corresponds to a height-position detecting part that detects a relative height position of the transfer base member 5 relative to the wafer boat 3, the elevating and lowering mechanism 52 corresponds to a driving part that is controlled based on the height position detected by the encoder 55, and the counter 56 corresponds to a reading means that reads the height position detected by the encoder 55 when the optical sensor 6 detects the ring member 38 as the specific portion. The detected values of the light-block data from the optical sensor 6, the pulse numbers of the encoder 55 when the data are detected, and the pulse values read by the counter 56 are outputted to the below-described control part 7, and these values are calculated by the control part 7 as the height position data of the respective ring members 38 in the wafer boat 3.

Next, the control part 7 is described with reference to FIG. 6. The control part 7 is incorporated in a computer, and includes a data processing part formed of a program, a memory, and a CPU 71. The program incorporates instructions for implementing the below-described transfer order by sending control signals from the control part 7 to the respective elements of the thermal processing apparatus. A screen of the computer serves as a display means 81 through which a predetermined substrate process and a predetermined inspection process can be selected, and parameters in the respective processes, a first threshold value A, and a second threshold value B, which are described below, can be inputted. In addition, the display means 81 can display the below-described inspection result. The program is stored in a storage part such as a computer storage medium, e.g., a flexile disc, a compact disc, a hard disc, an MO (magneto-optic disc), and is installed in the control part 7.

In order to inspect the height positions of the ring members 38 of the wafer boat 3, the control part 7 includes an inspection program 72 of the wafer boat 3, a reference-data storage part 73, and obtained-data storage part 74. The control part 7 can send predetermined control signals to the elevating and lowering mechanism 52 of the forks 41a to 41e, the encoder 55, the counter 56, the optical sensor 6, the display means 81 of the computer, and an alarm issuing means 82. The reference-data storage part 73 is a means for storing height position data of the respective ring members 38 of the wafer boat 3, when the height positions of the ring members 38 are normal. The obtained-data storage means 74 is a means for storing height position data of the respective ring members 38 of the wafer boat 3 to be inspected.

The inspection program 72 includes a means 72a for controlling the drive of the wafer transfer mechanism 4 during inspection, a difference detecting means 72b, and a judging means 72c for judging a manner of a wafer W to be delivered by the wafer transfer mechanism 4 to the wafer boat 3. The difference detecting means 72b is a means for calculating a deviation that is a difference between the reference data stored in the reference-data storage part 73 and the obtained data stored in the obtained-data storage part 74. The judging means 72c judges whether the transfer operation of a wafer W can be performed by comparing the difference (deviation) and the preset threshold values A and B, and outputs a delivery command (transfer command) to the wafer transfer mechanism 4 through the drive control means 72a when a wafer W is transferred. On the other hand, when a wafer W can not be transferred, the judging means 72c outputs a command for forbidding delivery (transfer operation) of a wafer W to the wafer transfer mechanism 4 through a transfer forbidding means 72d which is described below, and outputs a command for displaying a predetermined alarm. Herein, to display an alarm means to turn on the alarm issuing means 82 such as a lamp, to generate an alarm sound, and to display an alarm on the display means 81 of the computer. The inspection program 72 includes the transfer forbidding means 72d that outputs a transfer forbidding command to the wafer transfer mechanism 4 so as to control the wafer transfer mechanism 4, when the judging means 72c judges that the transfer operation of a wafer W can not be performed.

Next, a flow of wafers W in the above-described vertical thermal processing apparatus is described. Firstly, in the wafer boat 3, data as to the height positions of the respective ring members 38 of the wafer boat 3 are previously obtained as normal reference data, before a process is performed, e.g., when the apparatus is set up and no thermal effect is given to the wafer boat 3 (S1), and threshold values are set for evaluating deviations (S2). As the threshold values, there are set the first threshold value A which is a critical deviation at which a batch transfer of wafers by the five forks 41a to 41e can be performed, and the second threshold value B which is a critical deviation at which the batch transfer by the five forks can not be performed but a single transfer of a wafer by the single fork 41c can be performed. In this embodiment, the first threshold value A is set at 1.00 mm, and the second threshold value B is set at 2.00 mm.

The reference data can be obtained as follows. For example, as shown in FIG. 4, the transfer base member 5 is moved to a position on which the third fork 41c is located below the lowermost ring member 38b of the wafer boat 3, and the fork 41c is moved up to the inspection position. As shown in FIGS. 4 and 6, the inspection position is a position at which, when the transfer base member 5 is elevated and lowered, the fork 41c does not interfere with the ring parts 38 but the optical axis L of the optical sensor 6 fixed on the distal end of the fork 41c is blocked by the ring parts 38. Then, the transfer base member 5 is gradually elevated up to a position at which the third fork 41c is located above the uppermost ring member 38a of the wafer boat 3. In this manner, at the height positions where the ring members 38 are present, the optical axis L of the optical sensor 6 is blocked by the ring members 38, whereby light-block data are obtained. By reading the pulse numbers of the encoder 55 at these timings by the counter 56, the relative height position of the transfer base body 5 with respect to the wafer boat 3 can be determined, and these data are obtained as the reference data of the height positions of the ring members 38.

Then, in the vertical thermal processing apparatus, the carrier C is placed on the first table 24 by an automatic transfer robot, not shown, which is moved along a ceiling part of the clean room. Then, the carrier C is transferred to the second table 25 by the carrier transfer mechanism 27, and the carrier C is hermetically brought into contact with the opening 20 of the partition wall 21 by a not-shown mechanism. There is a case in which the carrier C is temporarily stored in the carrier storage part 26, and is then transferred to the second table 25.

Thereafter, the lid member is removed from the carrier C by the lid opening/closing mechanism 29, and an inert gas such as a nitrogen gas is blown from the gas supply pipe, not shown, into the carrier C. Thus, the space between the carrier C and the door 28 of the carrier C is filled with the nitrogen gas. Subsequently, the door 28, the lid opening/closing mechanism 29, and the lid member are elevated, for example, so as to be retracted from the opening 20, so that the inside of the carrier C and the loading area S2 are in communication with each other.

On the other hand, in the wafer boat 3, before wafers W are transferred, e.g., at a timing when thermally processed wafers W are taken out from the wafer boat 3, and at a timing after thermally processed wafers W have been already taken out from the wafer boat 3 and before wafers W to be thermally processed subsequently are not yet transported to the wafer boat 3, data as to the height positions of the respectively corresponding ring members 28 of the wafer boat 3 are obtained by the same manner as the manner by which the reference data are obtained, and the obtained data are stored in the obtained-data storage part 74 (S3). Then, the judging means calculates differences between the reference data and the obtained data so as to obtain deviations, and compares the deviations with the threshold values A and B so as to judge whether the height positions of the ring members 38 are abnormal or not (S4).

The above method is concretely described with reference to the data shown in FIGS. 8 to 10. For example, when the deviations of all the ring members 38 are less than 1.00 mm, as shown in the obtained data 1 of FIG. 8, since the deviations fall below the first threshold value A, the height positions of the ring members 38 are judge to be normal. Thus, a command is outputted to the wafer transfer mechanism 4 such that wafers are transferred by the general batch transport in which five wafers W are transferred in batch by the five forks 41a to 41e (S5). At this time, since wafers are generally transported in batch by the five forks 41a to 41e, the deviations and the first and second threshold values A and B are compared for each set of five ring members 38 from the lowermost ring member 38b, for example. However, the comparison may be performed for each set of five ring members 38 from the uppermost ring member 38a.

In view of the obtained data 2 shown in FIG. 9, deviations of the ring members 38 from the uppermost level to the 5th level are not less than 1.00 mm but less than 2.00 mm. Namely, since the deviations exceed the first threshold value A but fall below the second threshold value B, a command is outputted to the wafer transfer mechanism 4 such that the batch transfer is switched from a simultaneous transfer mode in which five wafers W are transferred in batch by the five forks 41a to 41e, to the single transfer mode in which wafers are transferred one by one by the single fork 41c (step S6). In the ring members from the 6th level to the 10th level (step), only the deviation of the 6th ring member is not less than the first threshold value A but less than the second threshold value B, and the deviations of the 7th to 10th ring members are less than the first threshold value A. Even when only one of the deviation of the ring member 38 among the set of five ring members 38 is not less than the first threshold value A but less than the second threshold value B, a command is outputted to the wafer transfer mechanism 4 such that the batch transport is switched to the single transfer mode so as to transport wafers one by one (step S6). Since the deviations of the 96th to 100th ring members 38 are less than the first threshold value A, a command is outputted to the wafer transfer mechanism 4 such that the simultaneous transfer mode is performed by the five forks 41a to 41e (step S5).

In the obtained data 3 shown in FIG. 10, when the deviations of all the ring members 38 are not less than 2.00 mm, since the deviations exceed the second threshold value B, the height positions of the ring members 38 are judged to be abnormal, whereby a command is outputted to the wafer transfer mechanism 4 such that the transfer operation of wafers W is forbidden, and a command is outputted to the display means 81 of the computer and the alarm issuing means 82 such that an alarm is displayed (S7). Then, a predetermined recovery operation and/or a predetermined maintenance operation is performed by an operator. Specifically, the height positions of the ring members 38 of the wafer boat 3 are adjusted to the normal positions, and/or the ring member 38 is exchanged (S8).

When wafers W are transferred after data as to the height positions of the respective ring members 38 have been obtained in this manner, the wafers W in the carrier C are sequentially taken out therefrom by the five forks or the single fork, and are transported to the wafer boat 3. When no wafer W remains in the carrier C and the carrier C becomes vacant, the aforementioned operations are reversely operated. Namely, the lid member of the carrier C is closed, the second table 25 is moved backward so that the carrier C is separated from the partition wall 21, and the carrier C is transferred to the carrier storage part 26 where the carrier C is temporarily stored. After the predetermined number of wafers W have been placed in the wafer boat 3, the wafer boat 3 is carried into the thermal processing furnace 31, and the wafers W are subjected to a thermal process such as a CVD process, an annealing process, and an oxidation process.

After the thermal process has been finished, data as to the height positions of the respectively corresponding ring members 38 in the wafer boat 3 are obtained, in the same manner as the manner by which the reference data are obtained before the wafers W are transported, and the obtained data are stored in the obtained-data storage part 74. Then, the judging means calculates differences between the reference data and the obtained data so as to obtain deviations. By comparing the deviations with the threshold values, the judging means judges whether the height positions of the ring members 38 are abnormal or not. When the deviations are less than the first threshold value A, it is judged to be normal, and a command is outputted such that the simultaneous transfer mode (general batch transfer mode) is performed by the five forks. When the deviations are not less than the first threshold value A but less than the second threshold value B, it is judged that the single transfer mode can be performed so that the wafers are transferred one by one by the single fork. When the deviations are not less than the second threshold value B, it is judged to be abnormal, and commands are outputted such that the transfer operation of the wafers W is forbidden and that the aforementioned alarm is outputted. During such a transfer operation of wafers, the wafers W in the wafer boat 3 are returned to the carrier C in batch or one by one by the five forks or the single fork of the wafer transfer mechanism 4. The reference data showing the normal height positions of the ring members 38 of the wafer boat 3 can be obtained when there is no thermal effect at all, for example, at a timing when the apparatus is set up, or after teaching during maintenance.

In such a vertical thermal processing apparatus, before wafers W which are not yet subjected to a thermal process are transferred to the wafer boat, and before wafers W which have been already subjected to a thermal process are received from the wafer boat 3, whether the height positions of the ring members 38 of the wafer boat 3 are normal or not is inspected. When the deviations relative to the normal height positions are not less than the second threshold value B, it is judged to be abnormal and the transfer operation of the wafers W by the wafer transfer mechanism 4 is not performed. In this case, after the height positions of the ring members 38 have been adjusted, the transfer operation is performed. Namely, since the transfer operation of the wafers W is not performed from or to the wafer boat 3 that undergoes a severe thermal deformation by a thermal effect, the contact between the forks 41a to 41e and the wafers W and the contact between the forks 41a to 41e and the ring members 38 can be prevented from occurring. Therefore, the generation of scratches on the wafer W and generation of particles, which are caused by the contact, can be prevented, whereby reduction in throughput of products can be restrained as well as the wafer boat 3 can be prevented from being damaged.

According to the use of this present invention, the inevitable trouble based on a change over time, i.e., the deformation of the wafer boat 3 caused by a thermal effect can be prevented from occurring. In addition, since wafers W even with very small scratches and/or a small amount of particles cannot be shipped as products, the contact between the forks 41a to 41a and wafers W can be prevented, in restraining reduction in throughput.

Further, as described above, the contact between the forks 41a to 41e and wafers W and the contact between the forks 41a to 41e and the ring members 38 can be prevented from occurring. Thus, a significantly improved precision of the teaching operation to be previously performed is not required, whereby the structure of the apparatus and the program can be simplified. In addition, as described above, the present invention can be regarded as an invention for checking a change over time of the wafer boat 3 caused by a thermal effect. Thus, when the difference between the normal reference data and the obtained data becomes large to some extent, the present invention can be utilized to know the exchange timing of members such as the wafer boat 3 and the ring members 38.

Furthermore, When the deviations between the height positions of the ring members 38 of the wafer boat 3 and the normal height positions thereof are not less than the first threshold value A but less than the second threshold value B, it is judged that the transfer operation by the single fork can be performed and wafers are transferred one by one, although the batch transfer operation by the five forks is impossible. Thus, when the height positions of the ring members 38 are abnormal but the degree thereof is negligible, the transfer operation of the wafers W can be continuously performed. Thus, it is not necessary to stop the apparatus for each time, whereby reduction in working efficiency of the apparatus can be prevented.

Moreover, the inspection as to whether the height positions of the respective ring members 38 are normal or not is performed as follows. By providing the optical sensor 6 on the third fork 41c and relatively elevating and lowering the transfer base member 5 with respect to the wafer boat 3, data relating to the respective ring members 38 are obtained by the optical sensor 6. Based on this, whether the height positions of the ring members 38 are judged to be normal or abnormal. Thus, the operation required for the inspection is simple, and the inspection can be performed with a high precision for a short period of time. When the mapping sensor is utilized as the means for inspecting the specific portion, it is not necessary to prepare a new sensor, which is effective in terms of the structure of the apparatus and the cost.

In the present invention, it is possible to acquire accumulated data as to the height positions of the ring members 38 of the wafer boat 3, together with the parameters such as a temperature and a period of the thermal process and a cooling period of the wafer boat 3 after the thermal process, so as to estimate possible troubles based on the accumulated data. Namely, based on a predetermined thermal process temperature, a thermal process period, and a cooling period of the wafer boat 3, the times of the process with the wafer boat 3, which invites the contact between the ring members 38 and wafers and the contact between the forks 41 and wafers, may be estimated and the result may be displayed.

Instead of the ring members 38, the specific portions detected by the specific-portion detecting part may be the holding pawls by which wafers W can be held. Alternatively, when wafers W are directly held by grooves formed in the columns, the specific portions may be these grooves. When the height positions of the holding pawls and the grooves are detected by the optical sensor 6, the transfer base member 5 may be elevated and lowered such that the optical axis of the optical sensor 6 is blocked by the wafers W held by the holding paws or the grooves, and the height positions of the holding pawls or the grooves may be detected based on the light-block data. Further, it is possible to detect wafers W placed on the respective levels (steps) of the wafer boat 3 by the specific-portion detecting part.

The specific-portion detecting part may be provided on the forks 41a, 41b, 41d, and 41e, instead of the third fork 41c, or may be provided one of the transfer base member 5 and the wafer transfer mechanism 4. Further, a reflection type optical sensor may be used as the specific-portion detecting part.

In this case, a light ray from the light emitting part is reflected by peripheral surfaces of the ring members 38 and the wafers held by the holding pawls or grooves, whereby the height positions of the ring members 38 and the holding pawls or the grooves can be detected based on data obtained when the reflected light is received by the light receiving part. Alternatively, a camera and a positional sensor, instead of the optical sensor, may be used as the specific-portion detecting part.

Further, the height-position detecting part may detect relative height positions of certain regions of the wafer transfer mechanism 4 such as the forks 41a to 41e in addition to the transfer base body 5 with respect to the wafer boat 3. Alternatively, the height-position detecting part may detect the relative height position of the wafer transfer mechanism 4 with respect to the wafer boat 3 by detecting a rotational speed of the motor M2. Furthermore, a linear scale may be used as the height-position detecting part, and the scales of the linear scale may be read and counted by a reading means. In addition, when the height positions of the specific portions are detected, not the wafer transfer mechanism 4 but the wafer boat 3 may be elevated and lowered.

Moreover, the present invention may be applied to a substrate transfer means that performs only a batch transfer of wafers by means of a plurality of holding arms. In this case, one threshold value is set. The substrate transfer means is controlled such that, when deviations between the reference data and the obtained data are less than the threshold value, the wafers are transferred in batch by the holding arms, and that, when deviations exceed the threshold value, the transfer operation of the wafers W by the holding arms is forbidden. In addition, the present invention may be applied to a substrate transfer means having only one holding arm.

In the above example, the difference detecting means 72b of the control part 7 calculates a difference |An−Bn| in which An represents the height position of the n-th specific member (in this example, the ring member) of the wafer boat 3 in the normal condition and Bn represents the height position of the n-th specific member of the thermally processed wafer boat 3, and compares the difference |An−Bn| with the threshold values. However, not limited thereto, the difference detecting means 72b may calculate a difference |(An−A(n−1))−(Bn−B(n−1)|, and the judging means 72c may evaluate a thermal deformation by comparing the difference with the threshold values.

Namely, the difference detecting means 72b of the control means 7 may calculate a difference in distance between the n-th specific member in the normal condition and the (n−1)th specific member adjacent thereto.

The invention claimed is:
1. A vertical thermal processing apparatus comprising:
   a thermal processing furnace;
   a substrate holder configured to be carried into the thermal processing furnace and to hold a substrate;
   a substrate transfer means including a holding arm configured to hold a substrate and a transfer base member configured to support the holding arm;
   a height-position detecting part disposed on the substrate transfer means, the height-position detecting part being configured to detect a height position of the substrate transfer means with respect to the substrate holder;
   a driving part controlled based on the height position detected by the height-position detecting part, the driving part being configured to relatively elevate and lower the substrate transfer means with respect to the substrate holder;
   a specific-portion detecting part disposed on the substrate transfer means, the specific-portion detecting part being configured to detect, when the substrate transfer means is relatively elevated and lowered with respect to the substrate holder, a substrate placed on each step of the substrate holder or a specific portion of the substrate holder, the specific portion having a specific relationship with respect to each substrate;

a means configured to read the height position detected by the height-position detecting part, when the specific-portion detecting part detects the substrate or the specific portion; and a control part configured to control the substrate transfer means;

wherein the control part includes:

a difference detecting means configured to calculate a difference between a normal height position of each substrate or a normal height position of each specific portion, which height position is obtained by relatively elevating and lowering the substrate transfer means with respect to the substrate holder under the condition that the substrate holder is not subjected to a thermal effect, and a height position of each corresponding substrate or a height position of each corresponding specific portion, which height position is obtained by relatively elevating and lowering the substrate transfer means with respect to the substrate holder at a time of the operation of the vertical thermal processing apparatus;

a judging means configured to compare the difference and a threshold value and to judge whether the transfer operation of the substrate from or to the substrate holder can be performed or not based on the comparison result; and a means configured to forbid the transfer operation of the substrate by the substrate transfer means, when the judging means judges that the transfer operation of the substrate can not be performed.

2. The vertical thermal processing apparatus according to claim 1, wherein:

the substrate transfer means is structured to be capable of switching from a single transfer mode of one substrate by the one holding arm to a simultaneous transfer mode of a plurality of substrates by the plurality of holding arms; and the judging means compares the difference with a first threshold value and with a second threshold value that is larger than the first threshold value, and the judging means judges that the transfer operation of the substrates by the plurality of holding arms can be performed when the difference is less than the first threshold value;

the judging means judges that the transfer operation of the substrate by the one holding arm can be performed when the difference is not less than the first threshold value but less than the second threshold value; or the judging means judges that the transfer operation of the substrate from or to the substrate holder can not be performed when the difference is not less than the second threshold value.

3. The vertical thermal processing apparatus according to claim 1, wherein the specific-portion detecting part is formed of a mapping sensor including a light-emitting part and a light-receiving part for detecting presence of the plurality of substrates placed on each step of the substrate holder.

4. The vertical thermal processing apparatus according to claim 1, wherein the substrate holder includes a ring member interposed between the substrates placed in the substrate holder, the substrates being adjacent to each other in an up and down direction, and the specific portion corresponds to the ring member.

5. The vertical thermal processing apparatus according to claim 1, wherein the time of the operation of the vertical thermal processing apparatus corresponds to a timing before a thermally processed substrate is taken out from the substrate holder.

6. The vertical processing apparatus according to claim 1, wherein the time of the operation of the vertical processing apparatus corresponds to a timing after a thermally processed substrate have been already taken out from the substrate holder and before a substrate to be thermally processed subsequently is not yet transferred to the substrate holder.

7. A vertical thermal processing apparatus comprising:

a thermal processing furnace;

a substrate holder configured to be carried into the thermal processing furnace and to hold a substrate;

a substrate transfer means including a holding arm configured to hold a substrate and a transfer base member configured to support the holding arm;

a height-position detecting part disposed on the substrate transfer means, the height-position detecting part being configured to detect a height position of the substrate transfer means with respect to the substrate holder;

a driving part controlled based on the height position detected by the height-position detecting part, the driving part being configured to relatively elevate and lower the substrate transfer means with respect to the substrate holder;

a specific-portion detecting part disposed on the substrate transfer means, the specific-portion detecting part being configured to detect, when the substrate transfer means is relatively elevated and lowered with respect to the substrate holder, a substrate placed on each step of the substrate holder or a specific portion of the substrate holder, the specific portion having a specific relationship with respect to each substrate;

a means configured to read the height position detected by the height-position detecting part, when the specific-portion detecting part detects the substrate or the specific portion; and a control part configured to control the substrate transfer means;

wherein the control part includes:

a difference detecting means configured to calculate a difference between a normal distance between each substrate and a substrate adjacent to the substrate or a normal distance between each specific portion and a specific portion adjacent to the specific portion, which distance is obtained by relatively elevating and lowering the substrate transfer means with respect to the substrate holder under the condition that the substrate holder is not subjected to a thermal effect, and a distance between each corresponding substrate and the substrate adjacent to the substrate or a distance between each corresponding specific portion and the specific portion adjacent to the specific portion, which distance is obtained by relatively elevating and lowering the substrate transfer means with respect to the substrate holder at a time of the operation of the vertical thermal processing apparatus;

a judging means configured to compare the difference and a threshold value and to judge whether the transfer operation of the substrate from or to the substrate holder can be performed or not based on the comparison result; and a means configured to forbid the transfer operation of the substrate by the substrate transfer means, when the judging means judges that the transfer operation of the substrate can not be performed.

* * * * *